United States Patent
Kitamura

(10) Patent No.: US 7,372,745 B2
(45) Date of Patent: May 13, 2008

(54) SEMICONDUCTOR MEMORY DEVICE WITH NO LATCH ERROR

(75) Inventor: Mamoru Kitamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/517,315

(22) Filed: Sep. 8, 2006

(65) Prior Publication Data
US 2007/0058459 A1    Mar. 15, 2007

(30) Foreign Application Priority Data
Sep. 14, 2005    (JP)    ............... 2005-266614

(51) Int. Cl.
*G11C 7/00*    (2006.01)
(52) U.S. Cl. .................. 365/189.05; 365/193; 365/233
(58) Field of Classification Search ........... 365/189.05, 365/193, 233
See application file for complete search history.

(56) References Cited

U.S. PATENT DOCUMENTS 6,512,719 B2 *   1/2003   Fujisawa et al. ............ 365/233
6,680,866 B2 *   1/2004   Kajimoto ............... 365/189.01

FOREIGN PATENT DOCUMENTS

| JP | 2000-156083 | 6/2000 |
|---|---|---|
| JP | 3317912 | 6/2002 |
| JP | 2003-59267 | 2/2003 |
| JP | 2003-272379 | 9/2003 |

* cited by examiner

*Primary Examiner*—Son Dinh
(74) *Attorney, Agent, or Firm*—McGinn IP Law Group, PLLC

(57) ABSTRACT

A dynamic random access memory (DRAM) includes a data signal input circuit configured to input a data signal in response to a data control signal, and a data strobe signal input circuit configured to input a data strobe signal in response to a data strobe control signal. A control circuit separately generates the data control signal and the data strobe control signal. A data latch circuit latches the data signal from the data signal input circuit in response to the data strobe signal from the data strobe signal input circuit. A memory cell array has a plurality of memory cells arranged in a matrix. The latched data signal is stored in a selected one of the plurality of memory cells through the data buffer, an amplifier circuit configured to amplify a data signal read out from the selected memory cell; and an output circuit configured to output the amplified data signal.

16 Claims, 15 Drawing Sheets

SEMICONDUCTOR MEMORY DEVICE WITH NO LATCH ERROR

BACKGROUND OF THE INVENTION

1. Field of the Invention

The present invention relates to a semiconductor memory device such as a DRAM, and a method of preventing a latch error in the same.

2. Description of the Related Art

Recently, a semiconductor memory device, e.g. a double data rate type a dynamic random access memory of (to be referred to as a DDR DRAM) is used mainly. Also, a synchronous DRAM in which a read and write operations are synchronous with a clock signal (to be referred to as an SDRAM) is popular.

FIG. 1 is a block diagram showing the configuration of a conventional DDR DRAM. Referring to FIG. 1, the conventional DDR DRAM is provided with an address circuit, a command circuit, a memory cell array 15, a data circuit and a clock circuit. The address circuit is composed of an address terminal group 10, an address input circuit 11, an address latch circuit 12, an address buffer circuit 13, and an address decoder 14. The command circuit is composed of a command terminal group (/CS, /RAS, /CAS, and /WE) 17, a command input circuit 18, a command decoder & mode register 19, a control circuit (1) 20, and a control circuit (2) 21. The clock circuit is composed of a clock terminal group (CK, /CK) 22 and 23, a clock input circuit & internal clock signal generating circuit 24, and a DLL circuit 25. The data circuit is composed of a data terminal (DQ) 26, a data strobe terminal (DQS) 27, a reference voltage (Vref) terminal 28, a data signal input circuit 30, a data strobe signal input circuit 31, a data latch circuit 32, a data signal output circuit 33, a data strobe signal output circuit 34, a data buffer & data amplifier 29, and a sense amplifier circuit 16. Although a plurality of data terminals may be provided, only one of the data terminals is shown here for convenience.

An address is supplied to the address input circuit 11 through the address terminal group 10, and then is latched by the address latch circuit 12. A part of the latched address is supplied to the command decoder and mode register 19. The latched address is supplied to the decoder 14 through the address buffer 13 and decoded and supplied to the memory cell array 15. The memory cell array 15 has memory cells arranged in a matrix and one of rows of memory cells is designated based on the decoded result. A command is supplied to the command decoder & mode register 19 through the command input terminal group 17 and the command input circuit 18. The command decoder & mode register 19 receives the address from the address latch circuit 12 and an internal clock signal (ICK) S1 from the input circuit & internal clock signal generating circuit 24 in addition to the command and outputs control signals to the control circuits 20 and 21. External clock signals CK and /CK are supplied to the clock input circuit & internal clock signal generating circuit 24 and the DLL circuit 25 through the external clock signal terminals 22 and 23. The clock input circuit & internal clock signal generating circuit 24 generates internal clock signal (ICK and /ICK) S1 and S2, and outputs the internal clock signal (ICK) S1 to the command decoder & mode register 19, the address latch circuit 12, the control circuit 21 and the data latch circuit 32, and the internal clock signal (/ICK) S2 to the data latch circuit 32. The DLL circuit 25 outputs a synchronous signal to the data signal output circuit 33 and the data strobe signal output circuit 34. The control circuit 20 outputs control signals to the address buffer 13 and the sense amplifier circuit 16. The control circuit 21 outputs control signals to the address buffer 13, the data buffer and data amplifier 29, the data signal output circuit 33 and the data strobe signal output circuit 34, and the data signal input circuit 30 and the data strobe signal input circuit 31. The data strobe signal input circuit 31 receives a data strobe signal and outputs it to the data latch circuit 32 as a signal S4. The data signal input circuit 30 receives an external data signal and outputs it to the data latch circuit 32. The data latch circuit 32 receives the data signal in response to the data strobe signal and outputs to the data buffer and data amplifier 29. The sense amplifier circuit 16 writes the data signal received from the data amplifier 29 through the sense amplifier circuit 16 into one memory cell of the memory cell array 15. A data signal read out from the memory cell array 15 by the sense amplifier circuit 16 is supplied to the data signal output circuit 33 through the data buffer and data amplifier 29. The data signal output circuit 33 outputs the read-out data signal through the terminal 26, and the data strobe signal output circuit 34 outputs the data strobe signal through the terminal 27. A reference voltage (Vref) terminal 28 is connected to the data signal input circuit 30, the data strobe signal input circuit 31, the address input circuit 11, and the command input circuit 18.

A typical operation of each section in the DDR DRAM will be described below briefly, because it is well known to a person in the art. The internal clock signals (internal ICK signal S1, internal /ICK signal S2) are generated by the clock input circuit & internal clock signal generating circuit 24 from external clock signals CK and /CK supplied through the clock signal terminals 22 and 23. The address signal is supplied to the address terminal group 10, passes through the input circuit 11 and then is latched by the address latch circuit 12 in response to the internal clock signal S1. Then, the address is generated and outputted to the memory cell array 15 from the address buffer 13 and the address decoder 14. The command signal is supplied to the command terminal group 17, and passes through the command input circuit 18 to the command decoder & mode register 19. Then, signals for various operations are generated by the command decoder & mode register 19 in synchronous with the internal clock signal ICK S1. Further, instruction or control signals for the various operations are generated by the control circuit 20 and the control circuit 21. In a write operation, the data signal is supplied to the data signal input circuit 30 and latched by the data latch circuit 32 in response to the output signal S4 from the data strobe signal input circuit 31. Then, this data signal is written into the memory cell of the memory cell array 15 from the data buffer 29. In a read operation, the data signal in the memory cell is amplified by the sense amplifier circuit 16 and the data amplifier 29, and then this data signal is outputted to the data terminal 26 from the data signal output circuit 33 in response to an output signal of the DLL circuit 25.

The data strobe signal terminal 27 is provided in the DDR DRAM for the following reasons. In the DDR DRAM, the data effective width is only 0.5 clock period which is a half of the data effective width in a conventional SDRAM. There is usually a signal timing difference in data transfer between a memory and a memory controller, thereby reducing a timing margin. Thus, as the clock period becomes faster, the timing margin for data latch becomes smaller. For this reason, a data strobe (DQS) terminal 27 is provided for a data latch signal. The data latch signal is used in a write operation, as a signal for latching the data signal on the data terminal 26 in the DDR DRAM. In a read operation, the data latch signal is outputted from the DDR DRAM in synchronization with the data signal outputted from the data terminal 26, and is used as a signal for latching the data signal on the data terminal on the memory controller side.

FIGS. 2A to 2J are timing charts showing signal waveforms of various sections of the DDR DRAM in the write operation the read operation when the burst length is 4. Referring to FIGS. 2A to 2J, the waveforms of the signals on the data terminal 26 and the data strobe terminal 27 in the write and read operations will be described below.

In the write operation, as shown in FIG. 2D, the data strobe signal on the data strobe terminal 27 goes to a low level a predetermined time after a write command shown in FIG. 2C is received. This initial low level period is called a preamble period. Subsequently, the data strobe signal on the data strobe terminal 27 toggles between the high level and the low level in accordance with data D1, D2, D3, and D4 on the data signal. An input setup time and an input hold time are set for each of data D1 to D4, as shown in FIG. 2E. In response to the data strobe signal on the data strobe terminal 27 which goes to a high level, the data D1 is latched. The data strobe signal is lastly changed from the low level state to a high impedance state when the input of the last data D4 is completed. This last low level state is called a postamble state. In the read operation, after a read command (READ) shown in FIG. 2H, four bursts of data D1, D2, D3, and D4 are outputted from the data terminal 26, following the CAS latency which is set in the mode register 19 based on a mode set command, as shown in FIG. 2J. The data strobe signal on the data strobe terminal 27 is toggled in synchronization with the clock signal after a preamble period, as shown in FIG. 2I, and then the data strobe terminal 27 returns to a high impedance state through the postamble state.

Next, the data circuit will be described. FIG. 3 is a block diagram showing the configuration of the data circuit. The data circuit includes the data signal (DQ) input circuit 30, the data strobe signal (DQS) input circuit 31, and the data latch circuit 32. The data latch circuit 32 includes D-type flip-flop circuits 321, 322, 323, 324, and 325. The data signal input circuit 30 and the data strobe signal input circuit 31 receives an input control signal S5 from the control circuit 21. Also, the data signal input circuit 30 receives the data signal (DQ) and the reference voltage signal (Vref), and the data strobe signal input circuit 31 receives the data strobe signal (DQS) and the reference voltage signal (Vref). The output of the data signal input circuit 30 is connected to data (D) terminals of the D-type flip-flop circuits 321 and 324, and the output of the data strobe signal input circuit 31 is connected to clock (C) terminals of the D-type flip-flop circuits 321 and 324. Here, the clock terminal of the flip-flop 324 receives the data strobe signal by inverting it. The data output terminal of the D-type flip-flop circuit 321 is connected to the data terminal of the D-type flip-flop circuit 322, and the data output (Q) terminal of the flip-flop circuit 322 is connected to the data terminal of the D-type flip-flop circuit 323. The data output terminal of the flip-flop circuit 323 is outputted to a data line (1). Also, the data output terminal of the D-type flip-flop circuit 324 is connected to the data terminal of the D-type flip-flop circuit 325. The data output terminal of the flip-flop circuit 325 is outputted to a data line (2). The internal clock signal /ICK S2 is supplied to the clock terminal of the D-type flip-flop circuit 322, and the internal clock signal ICK S1 is supplied to the clock terminals of the D-type flip-flop circuits 323 and 325.

The data signal input circuit 30 and the data strobe signal input circuit 31 are formed as shown in FIG. 4. The input circuit 30 or 31 includes P-channel MOS transistors 100, 101, and 105, N-channel MOS transistors 102, 103, and 104, and an inverter 106. The P-channel MOS transistor 100 and the P-channel MOS transistor 101 form a current mirror circuit. The N-channel MOS transistors 102 and 103 form a differential transistor pair. The P-channel MOS transistor 100 and the N-channel MOS transistor 102 are connected in series. Similarly, the P-channel MOS transistor 101 and the N-channel MOS transistor 103 are connected in series. The N-channel MOS transistor 104 is provided between the ground and a common emitter node between the N-channel MOS transistor 102 and the N-channel MOS transistor 103. Further, the P-channel MOS transistor 105 and the inverter 106 are connected in series such that a node between the P-channel MOS transistor 101 and the N-channel MOS transistor 103 is connected to a node between the P-channel MOS transistor 105 and the inverter 106. The reference voltage signal Vref and an input signal (the data signal or the data strobe signal) are supplied to the gates of the N-channel MOS transistors 102 and 103, respectively, and the input control signal is supplied to the gate of the N-channel MOS transistor 104 and the gate of the P-channel MOS transistor 105. Therefore, if the data strobe signal as the input signal has a glitch, the voltage of the drain of the N-channel MOS transistor 103 is changed in response to the glitch, and a pulse signal is generated by the inverter circuit 106.

FIG. 5 shows each of the D-type flip-flop circuits 321, 322, 323, and 325, and is composed of transfer gates 110, 111, 112, and 113, and inverters 114, 115, 116, 117, and 118. FIG. 6 shows the D-type flip-flop circuit 324 and is composed of transfer gates 119, 120, 121, and 122, and inverters 123, 124, 125, 126, and 127.

The data signal input circuit 30 and the data strobe signal input circuit 31 are activated in the write operation. FIG. 7 is a block diagram showing the configuration of a part of the control circuit 21 as an input control signal generating circuit that generates the input control signal S5, and includes a write control circuit 1, a NOR circuit 2, and an inverter circuit 3. The write control circuit 1 receives a write command signal, various mode signals, the internal clock signal ICK S1, and write control signals, and outputs an input control signal S9. The NOR circuit 2 receives the input control signal S9 and the write control signal S10 as one of the write control signals. The inverter circuit 3 inverts the output of the NOR circuit 2 and output a DQ/DQS input control signal S5.

Next, referring FIGS. 8A to 8R, an operation of the input control signal generating circuit shown in FIG. 7 will be described in detail. FIG. 8A shows an external clock signal CK, and FIG. 8B shows another external clock signal /CK that is obtained by inverting the clock signal CK. In the DDR DRAM, in response to the CK and the /CK, the clock input circuit & internal clock signal generating circuit 24 generates an internal clock signal ICK S1 that is synchronous with the rising edge of the clock signal CK and the falling edge of the clock signal /CK, as shown in FIG. 8F, and an internal clock signal /ICK S2 that is synchronous with the falling edge of the clock signal CK and the rising edge of the clock signal /CK, as shown in FIG. 8G. When a write command (WRITE) is inputted at a time t0 as shown in FIG. 8C, a write command signal is generated by the command decoder 19 in response to the rising edges of the internal clock signal ICK, as shown in FIG. 8H. The input control signal S9 is generated in response to the rising edges of the internal clock signal ICK, based on a mode signal indicating the burst length and generated by the mode register 19 in response to a mode set command, as shown in FIG. 8I, and the signal width of the input control signal S9 is equivalent to clock periods corresponding to a half of the burst length. Also, a write control signal S10 is generated as shown in FIG. 8J by delaying the input control signal S9 by a summation of clock periods corresponding to the write latency and one clock period. The write control signal S10 is activated during a period when data is written into the memory cell array 15.

In FIGS. 8A to 8R, the burst length is 4 and the write latency is 1. Thus, the input control signal S9 shown in FIG. 8I has the signal width of 2 clock periods, and the write control signal S10 shown in FIG. 8J is a signal obtained by delaying the input control signal S9 by 2 clock periods. A DQ/DQS input control signal S5 shown in FIG. 8K is generated based on the input control signal S9 and the write control signal S10 by the NOR circuit 2 and the inverter circuit 3. Thus, when at least one of the input control signal S9 shown in FIG. 8I and the write control signal S10 shown in FIG. 8J is in the high level, the DQ/DQS input control signal S5 shown in FIG. 8K is in the high level.

An output of the input circuit shown in FIG. 4 is fixed to a low level when an input is in the low level, whereas when the input is in the high level, a differential amplifier circuit, composed of the P-channel MOS transistors 100 and 101 and the N-channel MOS transistors 102, 103, and 104, compares the input voltage level with the voltage level Vref on the reference voltage terminal 28 to generate an output signal. Specifically, as shown in FIGS. 8A to 8R, in the data signal and data strobe signal input circuits, when the input control signal S5 shown in FIG. 8K is in the low level, an input circuit output signal 53 shown in FIG. 8M and an input circuit output signal S4 shown in FIG. 8L are fixed to the low level, whereas when the input circuit control signal S5 shown in FIG. 8K is in the high level, the input circuit output signal S3 shown in FIG. 8M and the input circuit output signal S4 shown in FIG. 8L change as a result of input of the data signal and the data strobe signal. Next, in the write operation, the data D1 is supplied from the data terminal 26 to the data latch circuit 32 as the input circuit output signal S3 shown in FIG. 8M. That is, in more detail, the input circuit output signal S3 is supplied to the D-type flip-flop circuit 321, latched by it in response to the rising edge of the input circuit output signal S4 shown in FIG. 8L, and outputted as the signal S6 shown in FIG. 8N. Subsequently, the data signal S6 shown in FIG. 8N is latched again by the D-type flip-flop circuit 322 in response to the rising edge of the internal clock signal /ICK S2 shown in FIG. 8G, transferred as a signal S8 shown in FIG. 8P to the D-type flip-flop circuit 323, then latched in response to the rising edge of the internal clock signal ICK S1 shown in FIG. 8F, and transmitted onto the data line (1) shown in FIG. 8Q. The data D3 is also processed in the same manner, Meanwhile, the data D2 is supplied from the data terminal 26 to the D-type flip-flop circuit 324 as the data signal input circuit output signal S3 shown in FIG. 8M, and latched by the D-type flip-flop circuit 324 in response to the falling edge of the input circuit output signal S4 shown in FIG. 8L. The data output terminal signal as a signal S7 shown in FIG. 8O is latched by the D-type flip-flop circuit 325 in response to the rising edge of the internal clock signal ICK S1 shown in FIG. 8F, and then transmitted to the data line (2) shown in FIG. 8R.

Next, an operation will be described in a case that the data strobe signal has a glitch on the change of the output from the postamble period state to the high impedance state. Referring to FIGS. 9A to 9N, a glitch waveform in the write operation appearing when the data strobe signal is reset to the high impedance state after the postamble period will be described in detail.

Portions surrounded by circles of dotted line shown in FIG. 9D shows a glitch waveform of the data strobe signal. The data strobe signal input circuit 21 generates the glitch waveform at around a time t6, and changes the data strobe signal input circuit output signal S4 shown in FIG. 9H at around the time t6. In the DDR DRAM, the data strobe signal is permitted to shift from side to side with respect to the external clock signal CK. Thus, the shift of 0.3 clock period is permitted in the DDR DRAM called DDR 1. FIG. 9D is a timing chart showing the signal waveform of the data strobe signal being shifted to the left with respect to the CK so that a malfunction due to the data strobe glitch waveform is likely to occur.

The data signal S3 is supplied to the data signal terminal 26 and latched by the D-type flip-flop circuits 321, 322, and 324 in order as mentioned above. Also, the data signal S3 is latched by the D-type flip-flop circuits 324 and 325 in order as mentioned above. However, the signal S3 is latched by the D-type flip-flop circuit 324 in response to the rising edge of the data strobe signal input circuit output signal S4 shown in FIG. 9H. For this reason, a latter half of the data D4 is latched again in response to the glitch waveform to be overwritten, as shown in FIG. 9K. Therefore, the data D1 and D3 are transferred to the data line (1) as shown in FIG. 9M in response to the rising edge of the next internal clock signal ICK S1 shown in FIG. 9F. Also, the data D2 is properly transferred to the data line (2) as shown in FIG. 9N although the overwritten data D4 is not transferred thereto. Therefore, a problem is caused that the data D1, D2, and D3 are properly written into the memory cells, but the data D4 is not properly written into the memory cell.

In conjunction with the above description, Japanese Patent No. 3317912 discloses a semiconductor memory device. In this conventional example of the semiconductor memory device, a synchronization signal input section inputs a synchronization signal for data acquisition and outputs an internal synchronization signal. An acquiring section acquires data in synchronous with the internal synchronization signal. A storing unit stores the data. A control section sets the synchronization signal input section to an enable state or a disable state in response to input of a write command for writing the data into the storing unit. The control section sets the synchronizing signal input section to the enable state to output the internal synchronization signal, when the write command is inputted, and also starts counting the number of clock of the internal synchronization signal. Also, the control section sets the synchronizing signal input section to the disable state when the count reaches a certain reference number of times.

Japanese Laid Open Patent Application (JP-P2000-156083A) discloses a semiconductor device. In this conventional example of the semiconductor device, a serial data signal as external data signals is successively latched in synchronization with a data strobe signal. Also, the latching of the serial data signal in the internal circuit is inhibited in response to a timing of change in the data strobe signal corresponding to the final bit of the serial data signal.

Japanese Laid Open Patent Application (JP-P2003-59267A) discloses a semiconductor memory device. In this conventional example of the semiconductor memory device, 2N (N is natural number) data signals are successively received in synchronization with N pairs of leading and trailing edges which are contained in an external clock signal. Also, an external data strobe signal has the N pairs of leading and trailing edges in synchronization with the 2N data signals and is set to a reference voltage after the passage of the postamble period following the last trailing edge. The 2N data signals are latched in synchronization with the N pairs of leading and trailing edges which are contained in the external data strobe signal. Further, in the semiconductor memory device, an input buffer outputs an internal data strobe signal in accordance with the external data strobe signal. A gate circuit receives the internal data strobe signal outputted from the input buffer and inhibits the passage of the internal data strobe signal in response to inactivation of a first control signal. A latch circuit sequentially latches the 2N data signals in response to each of the leading and trailing edges contained in the internal data strobe signal that has passed through the gate circuit. A control circuit sets the first control signal to an inactivated level in response to the Nth trailing edge included in the internal data strobe signal.

As described above, a conventional input control circuit suffers from a problem that, when a data strobe signal is received in a manner to be shifted with respect to the clock signal CK, a proper data signal cannot be written into a memory cell. The cause of the occurrence of this problem is as follows. This is because the data strobe signal input circuit operates in response to a glitch waveform after the postamble of the data strobe signal.

In conjunction with the above description, a semiconductor memory device is disclosed in Japanese Laid Open Patent application (JP-P2003-272379A). In this conventional example, a memory cell array is provided. A clock generating circuit generates first and second internal clock signals in synchronization with the rising and falling edges of an external clock signal. A clock selecting circuit selects as a first operation clock signal, one of the first and second internal clock signals in accordance with the number of cycles from reception of a data read command from the memory cell array to start of output of the read data from the memory cell array, and selects the other as a second operation clock signal. One or more signal recovering circuits recover a signal outputted from the clock selecting circuit. An output circuit outputs the read data in synchronization with the first and second clock signals which are subjected to the recovery by the signal recovering circuits.

SUMMARY OF THE INVENTION

Therefore, an object of the present invention is to provide a semiconductor memory device such as a RAM, in which a latch error due to a glitch can be prevented.

In an aspect of the present invention, a dynamic random access memory (DRAM) includes a data signal input circuit configured to input a data signal in response to a data control signal, a data strobe signal input circuit configured to input a data strobe signal in response to a data strobe control signal, a control circuit configured to separately generate the data control signal and the data strobe control signal, a data latch circuit configured to latch the data signal from the data signal input circuit in response to the data strobe signal from the data strobe signal input circuit, a memory cell array having a plurality of memory cells arranged in a matrix, wherein the latched data signal is stored in a selected one of the plurality of memory cells through the data buffer, an amplifier circuit configured to amplify a data signal read out from the selected memory cell; and an output circuit configured to output the amplified data signal.

Here, the control circuit may generate the data strobe control signal to deactivate the data strobe signal input circuit before the data strobe signal inputted to the data strobe signal input circuit is set to a state other than high and low states.

Also, the data control signal and the data strobe control signal may be independent from each other at timing.

Also, the control circuit may include a write control circuit configured to generate first and second signals from an internal clock signal which is synchronized with an external clock signal, a write command signal and a mode signal specifying an operation mode; a first circuit configured to generate the data control signal from the first and second signals; and a second circuit configured to generate the data control signal from the first signal in response to an inversion signal of the data strobe signal.

Also, the second circuit may include a D-type flip-flop circuit configured to latch the first signal in resynchronization with an inversion signal of the internal clock signal to generate a third signal; a D-type latch circuit configured to pass the third signal in response to the data strobe signal to generate the strobe control signal; and an OR circuit configured to output a logical summation of said first signal and the passed third signal.

Also, the mode signal may be generated by an operation mode setting circuit based on an input command and indicates a number of data on the data signal.

Also, the mode signal may be generated based on a number of data on the data signal and a number of clock periods from the writing command signal to output of the data signal.

Also, the data strobe signal input circuit may further include a delay circuit configured to delay the data strobe signal, and the data strobe signal supplied to the data latch circuit may the delayed data strobe signal.

In another aspect of the present invention, an input control circuit includes a write control circuit configured to generate first and second signals from an internal clock signal which is synchronized with an external clock signal, a write command signal and a mode signal specifying an operation mode; a first latch circuit configured to latch the first signal in synchronization with a falling edge of an external clock signal; and a second latch circuit configured to pass an output signal of the first latch circuit for a period during which an output signal of a data strobe circuit is in a low level. The second latch circuit switches the data strobe circuit from an active state to an inactive state in response to an output signal of the second latch circuit.

Also, the second latch circuit may switch a falling edge of the output signal of the second latch circuit at a timing delayed for a period by which a write command is delayed.

In still another aspect of the present invention, an input control method is achieved by inputting a data signal in response to a data control signal; by inputting a data strobe signal in response to a data strobe control signal; by latching the data signal in response to the data strobe signal; and by separately generating the data control signal and the data strobe control signal.

Here, the separately generating is achieved by generating the data strobe control signal; and by setting a generation timing of the data strobe control signal in response to an internal clock signal associated with a low level period of the data strobe signal after the last data on the data signal.

Also, the separately generating is achieved by generating a first signal by counting an internal clock signal synchronized with the rising edge of an external clock signal, from a write command signal for an active stated of a preset signals; by generating a second signal by latching the first signal in response to an internal signal synchronized with a falling edge of an external clock signal; and by passing the second signal in response to an internal data strobe signal corresponding to a low level period of the data strobe signal.

Also, the preset signal may be a signal indicative of a number of the data.

Also, the preset signal is a signal indicative of a number of the data on the data signal and a number of clock cycles in a period from the write command signal to the data signal.

Also, the input control method may be achieved by further using a first output signal of the data strobe circuit to which a data strobe signal passing through a delay circuit is supplied for a data latch circuit; and using a second output signal of the data strobe circuit which does not pass the delay circuit for a control circuit.

DESCRIPTION OF THE PREFERRED EMBODIMENTS

Hereinafter, a semiconductor memory device such as a DDR DRAM of the present invention will be described with reference to the attached drawings.

Figure 1:
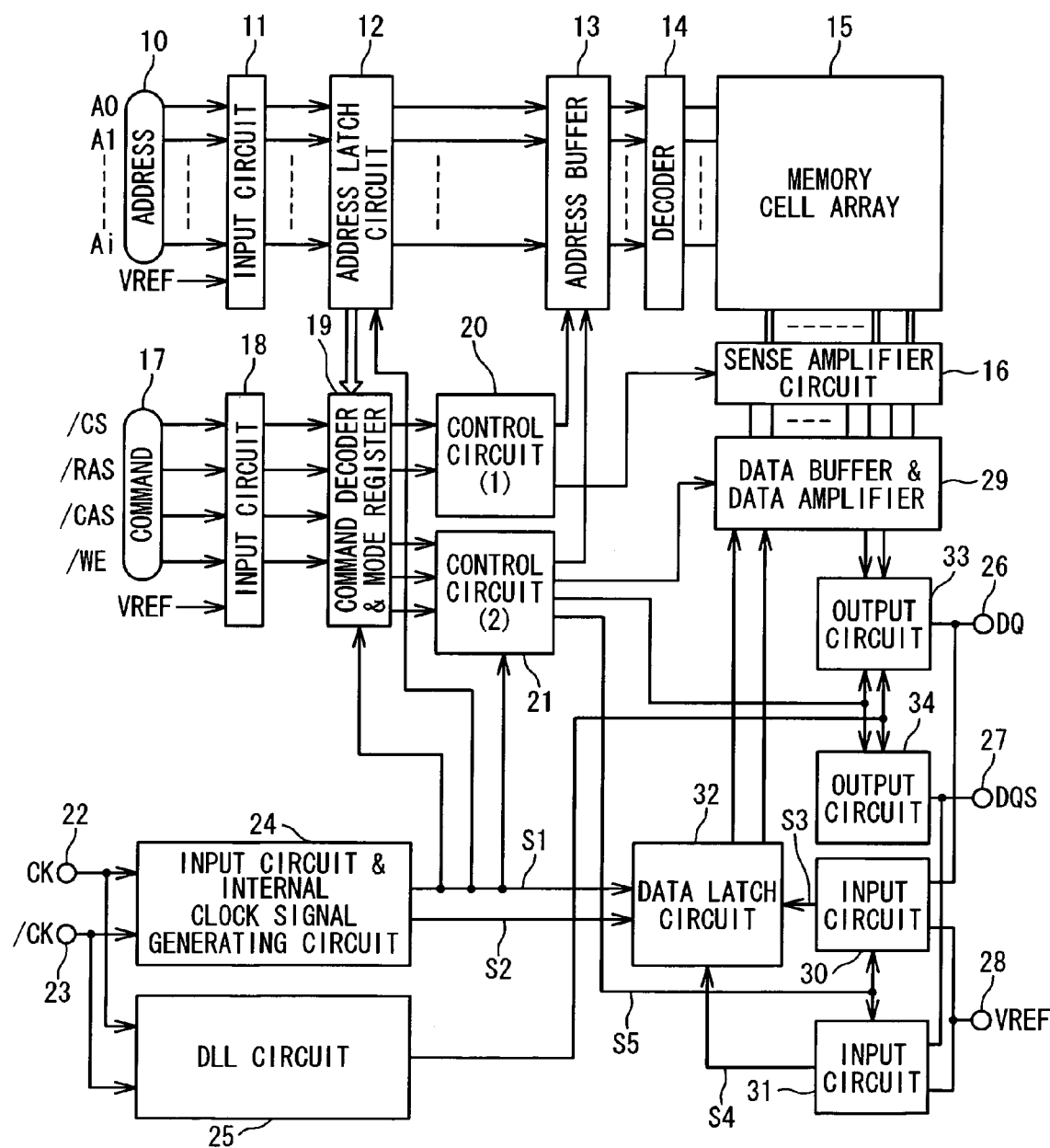
FIG. 1 is an overall block diagram of a conventional double data rate (DDR) DRAM.
Figure 2:
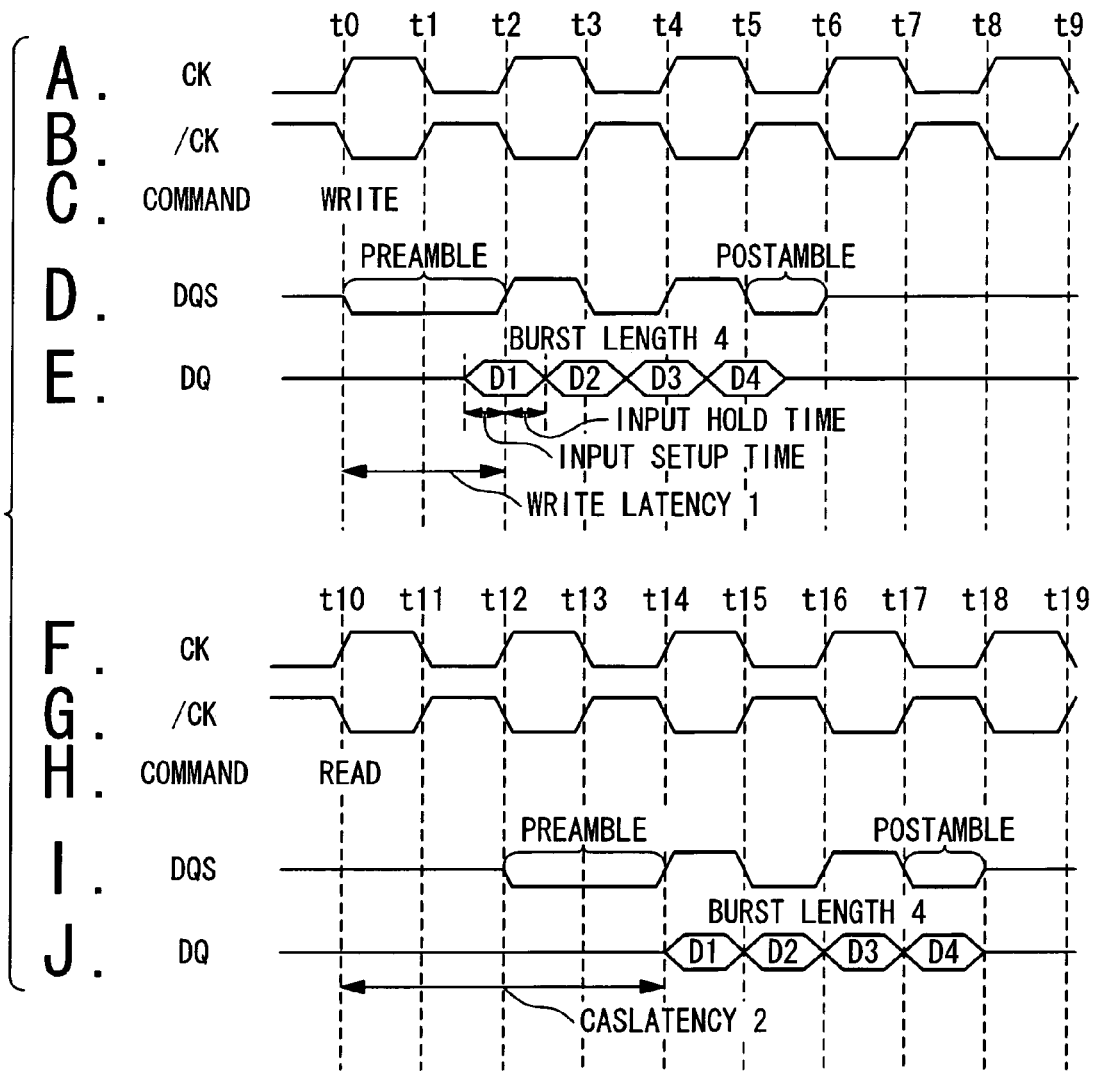
FIGS. 2A to 2J are timing charts showing signal waveforms in a write operation and a read operation of the conventional DDR DRAM.
Figure 10:
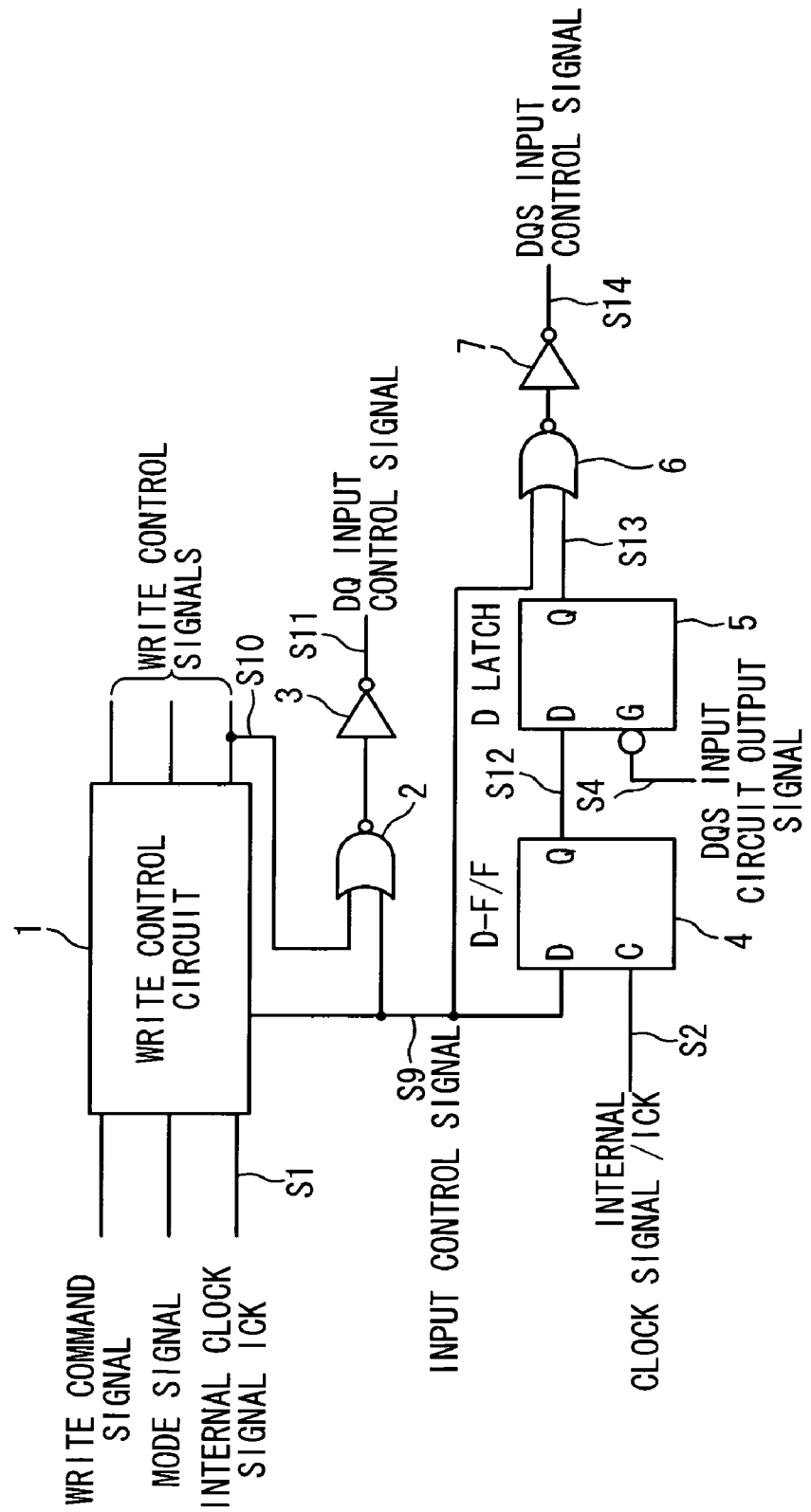
FIG. 10 is a block diagram showing an input control circuit used in a double data rate (DDR) DRAM according to a first embodiment of the present invention.

FIG. 10 is a block diagram showing an input control circuit according to the first embodiment of the present invention. The input control circuit is constituted as a part of the control circuit 21 of FIG. 1. Referring to FIG. 10, the input control circuit in the first embodiment is provided with a write control circuit 1; a NOR circuit 2; an inverter circuit 3; a D-type flip-flop circuit 4; a D-type latch circuit 5; a NOR circuit 6; and an inverter circuit 7. The write control circuit 1 receives a write command signal, a mode signal and an internal clock signal ICK and outputs write control signals and an input control signal S9 by counting the internal clock signal ICK based on the write latency, the number of burst data and/or the like. The input control signal S9 and one S10 of the write control signals are supplied to the NOR circuit 2 and the output of the NOR circuit 2 is inverted by the inverter circuit 3 and outputted as a data signal (DQ) input control signal S1. Also, the input control signal S9 is supplied to the data terminal of the D-type flip-flop 4 and the internal clock signal /ICK is supplied to the clock terminal of the D-type flip-flop 4. The output at the data output terminal of the D-type flip-flop 4 is outputted to the data terminal of the D-type latch circuit 5, which receives an inversion input of the data strobe signal input circuit output signal S4 at a G terminal. The data output terminal output of the D-type latch circuit 5 and the input control signal S9 are supplied to the NOR circuit 6, whose output is inverted by the inverter circuit 7 and outputted as a data strobe input control signal S14.

Figure 5:
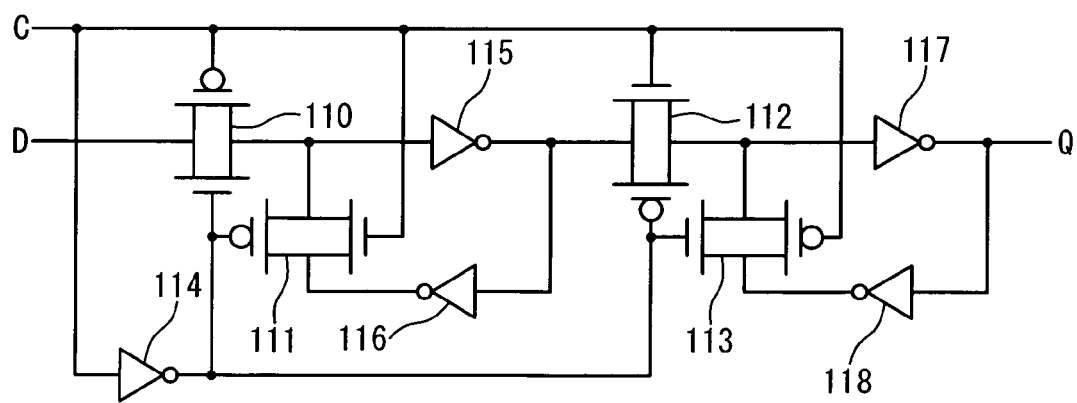
FIGS. 5 and 6 are block diagrams showing the configurations of a D-type flip-flop circuits shown in FIG. 2.
Figure 11:
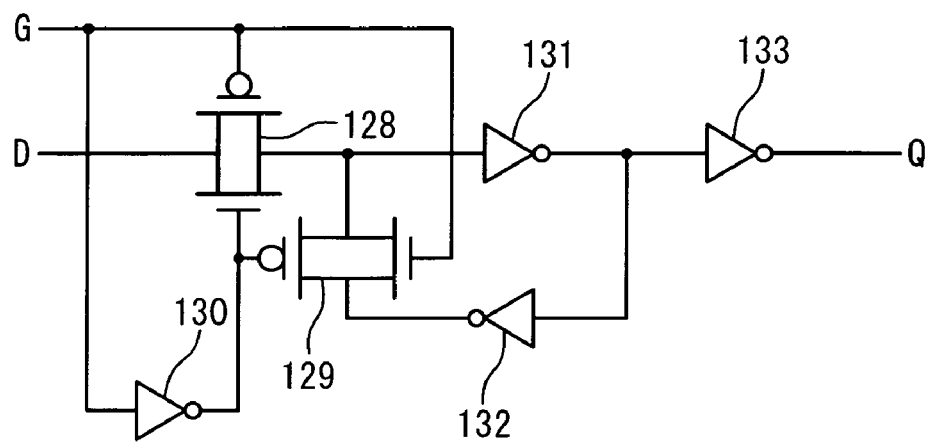
FIG. 11 is a block diagram of a D-type latch circuit used in FIG. 10.

As shown in FIG. 5, the D-type flip-flop circuit 4 is composed of transfer gates 110, 111, 112, and 113; and inverter circuits 114, 115, 116, 117, and 118. As shown in FIG. 11, the D-type latch circuit 5 is composed of transfer gates 128 and 129; and inverter circuits 130, 131, 132, and 133.

Figure 12:
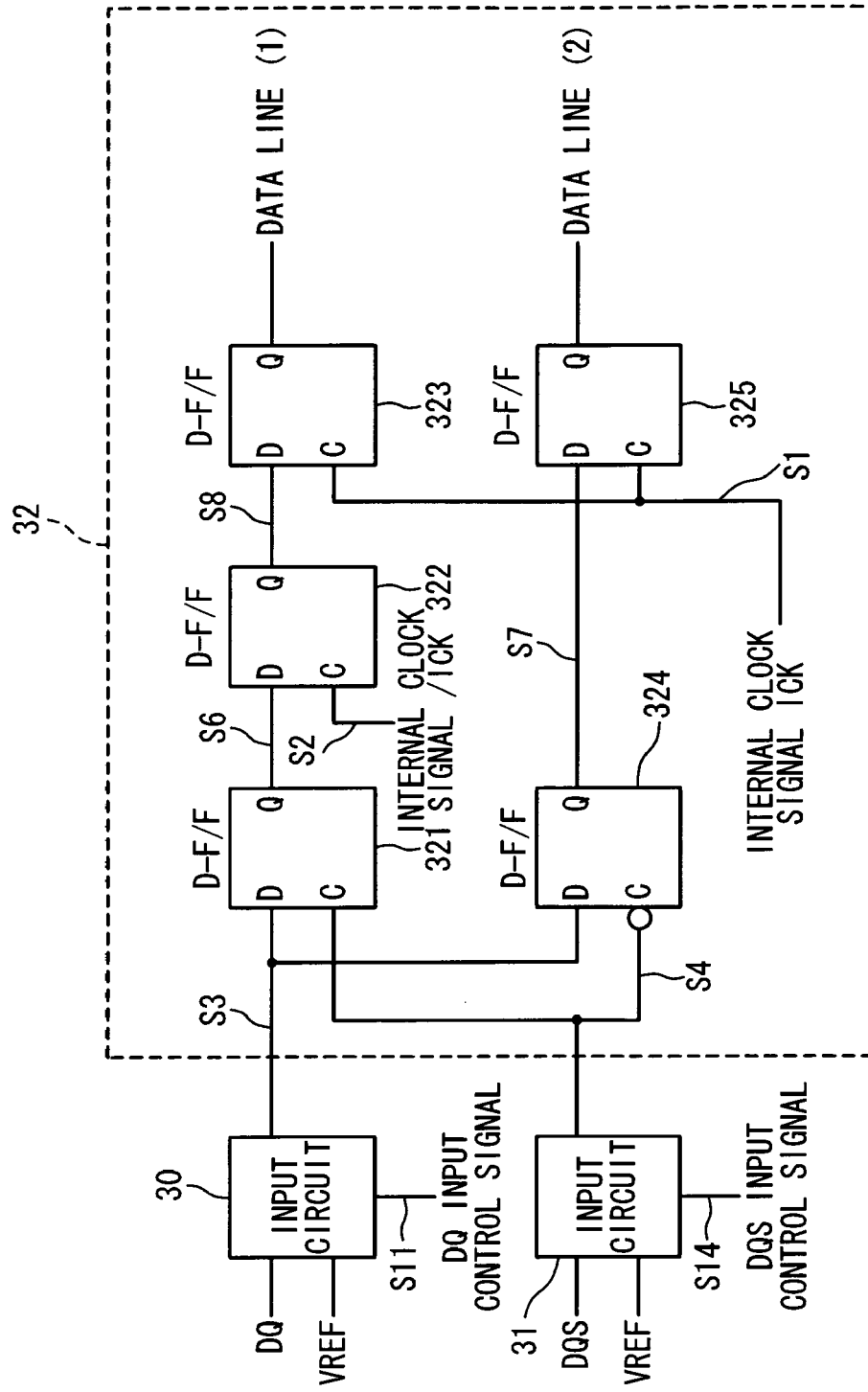
FIG. 12 is a block diagram showing the configuration of a data circuit in the DDR DRAM according to the first embodiment of the present invention.

FIG. 12 is a block diagram showing a data circuit when the control circuit of the present invention shown in FIG. 10 is used. The data circuit includes the data signal (DQ) input circuit 30, the data strobe signal (DQS) input circuit 31, and the data latch circuit 32. The data latch circuit 32 includes D-type flip-flop circuits 321, 322, 323, 324, and 325. The data signal input circuit 30 receives the data signal (DQ), the reference voltage (Vref) signal and the data input control signal S11 and outputs a data signal input circuit output signal S3 to the data terminals of the D-type flip-flop circuits 321 and 324. Also, the data strobe signal input circuit 31 receives the data strobe (DQS) signal, the reference voltage (Vref) signal and the data strobe input control signal S14, and output the data strobe signal input circuit output signal S4 to the clock terminal of the D-type flip-flop circuit 321 and the inversion clock terminal of the D-type flip-flop circuit 324. Here, the clock terminal of the flip-flop 324 receives the data strobe signal by inverting it. The data output terminal output of the D-type flip-flop circuit 321 as the signal S6 is connected to the data terminal of the D-type flip-flop circuit 322, and the data output terminal output of the D-type flip-flop circuit 322 as the signal S8 is connected to the data terminal of the D-type flip-flop circuit 323. The data output terminal output of the flip-flop circuit 323 is outputted onto a data line (1). Also, the data output terminal output of the D-type flip-flop circuit 324 as the signal S7 is connected to the data terminal of the D-type flip-flop circuit

325. The data output (Q) terminal output of the flip-flop circuit 325 is outputted onto a data line (2). The internal clock signal /ICK S2 is supplied to the clock terminal of the D-type flip-flop circuit 322, and the internal clock signal ICK S1 is supplied to the clock terminals of the D-type flip-flop circuits 323 and 325.

Figure 4:
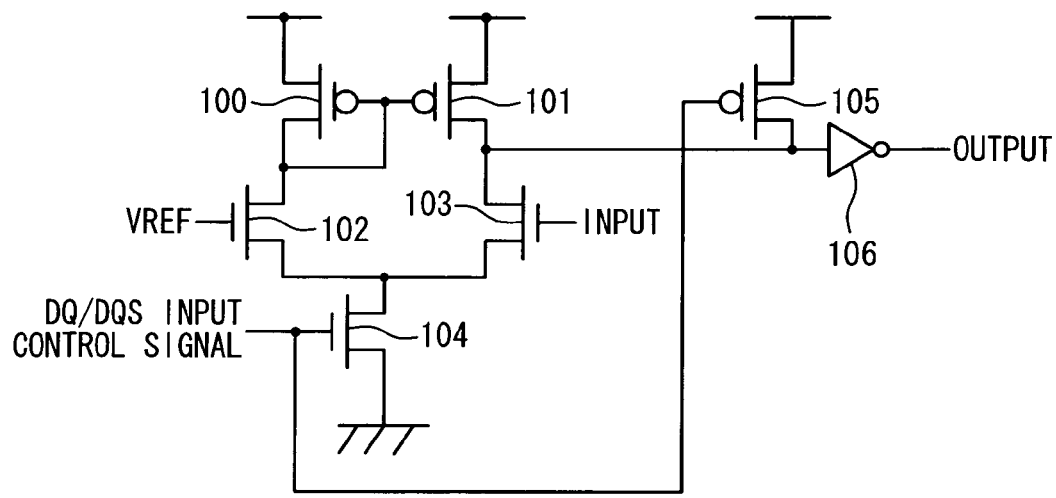
FIG. 4 is a block diagram showing the configuration of a data signal input circuit or a data strobe signal input circuit shown in FIG. 3.
Figure 6:
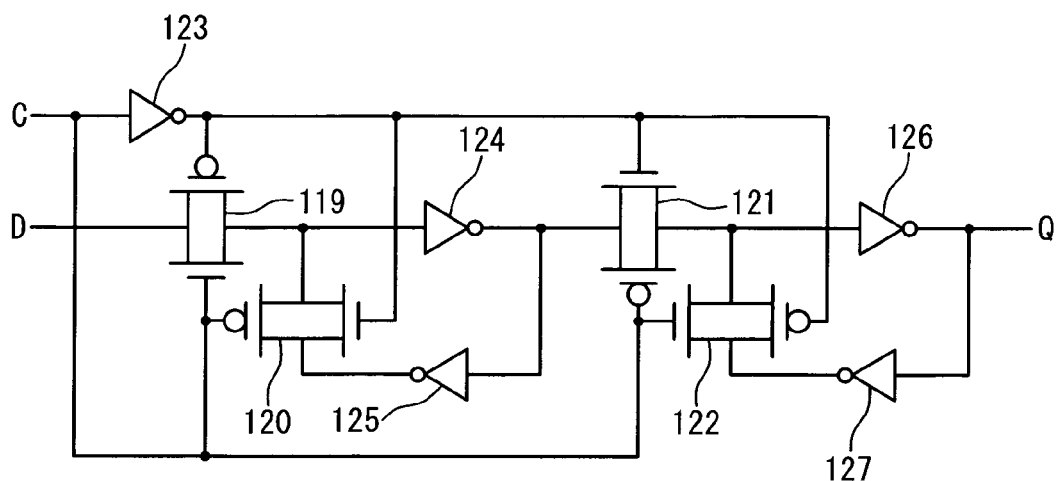
Figure 7:
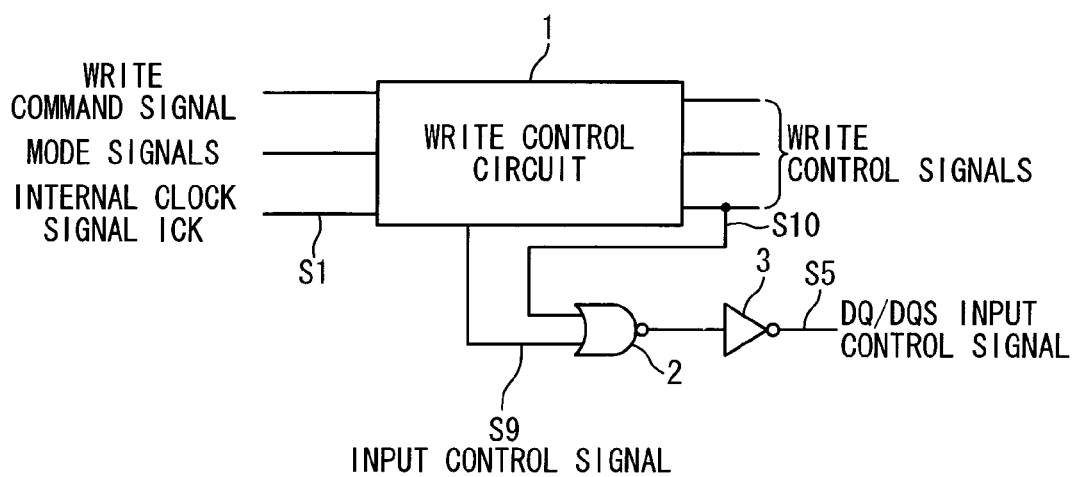
FIG. 7 is a block diagram showing an input control circuit used in the conventional DDR DRAM.
Figure 8:
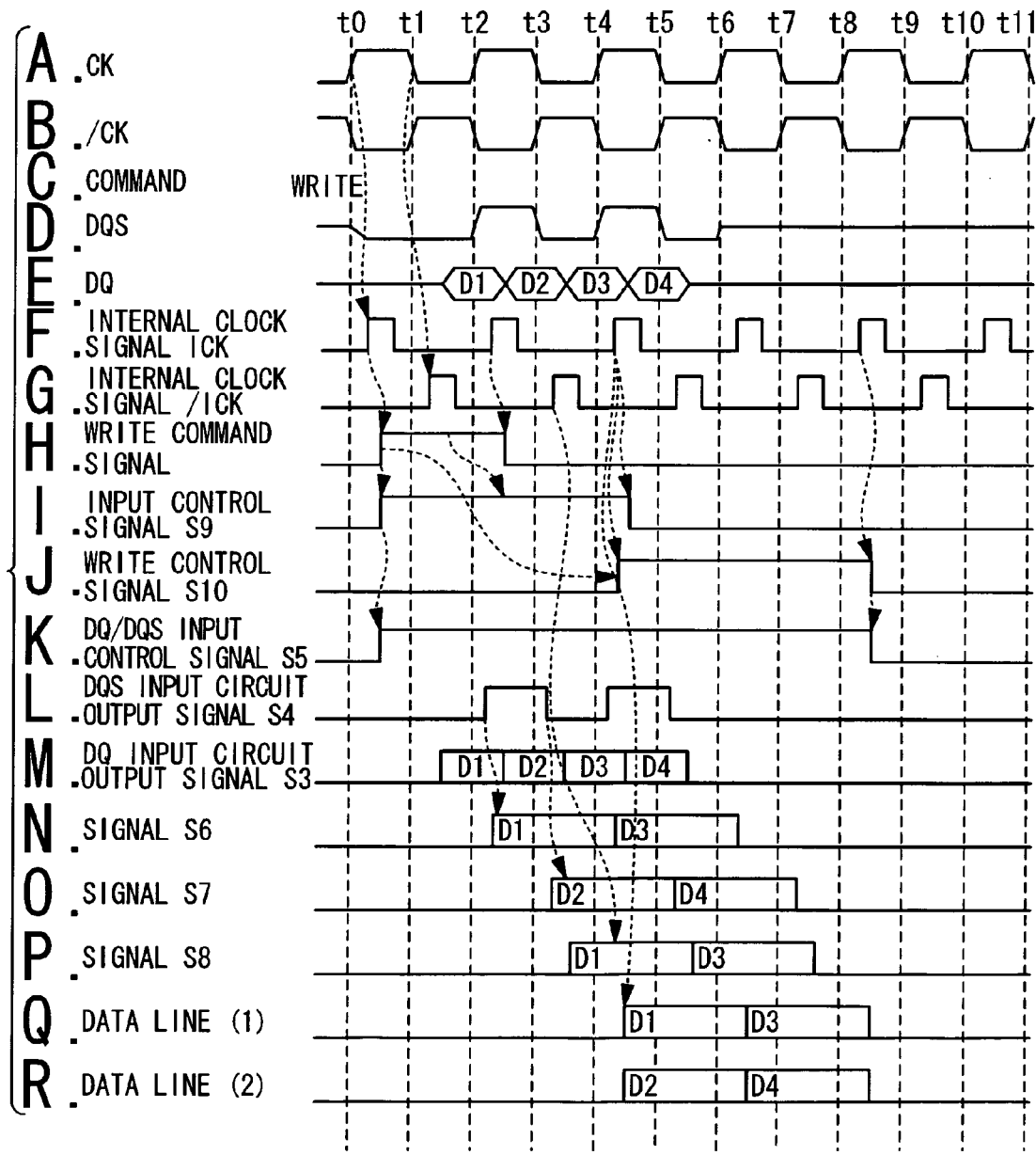
FIGS. 8A to 8R are timing charts showing signal waveforms of various sections in the conventional DDR DRAM in case of the burst length of 4 and the WRITE latency of 1.
Figure 9:
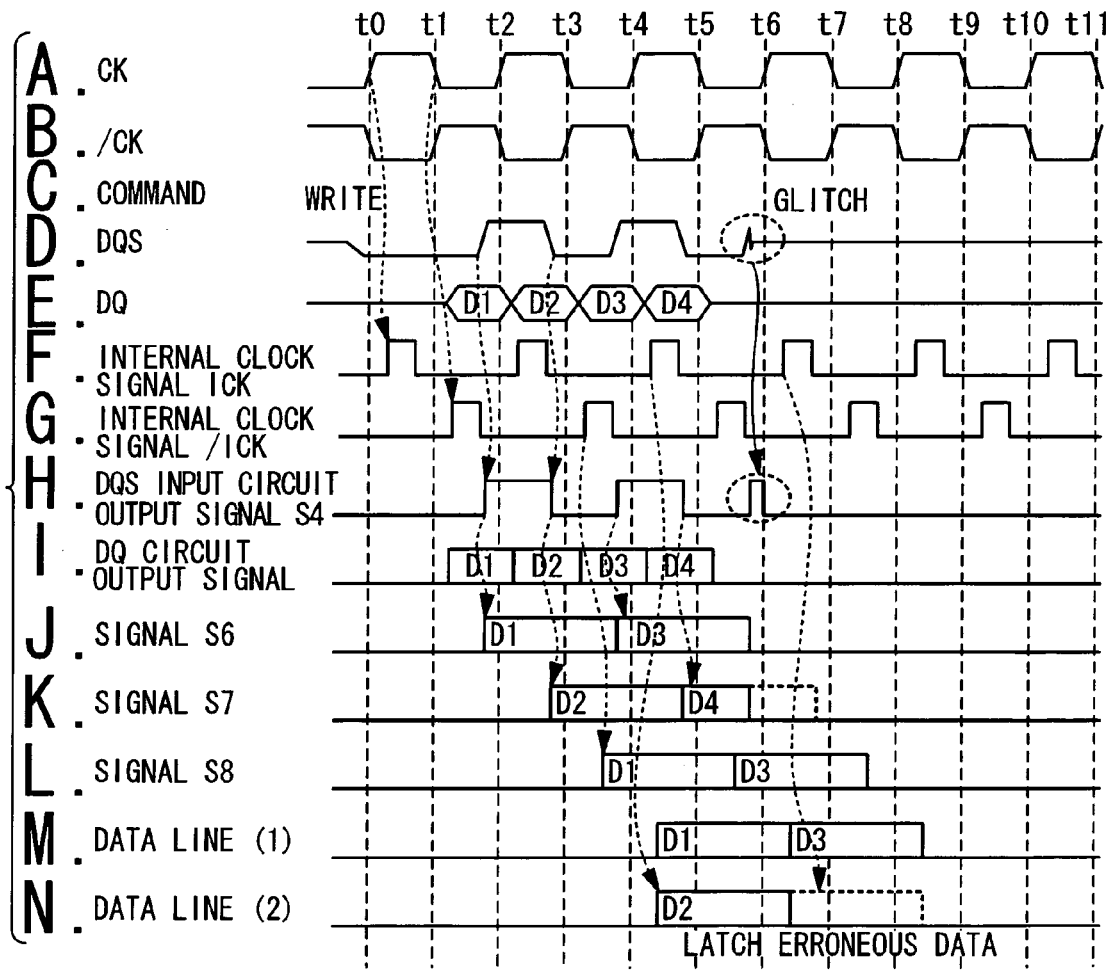
FIGS. 9A to 9N are timing charts showing signal waveforms of various sections when a glitch is caused in the conventional DDR DRAM in case of the burst length of 4 and the WRITE latency of 1.

The data signal input circuit 30 and the data strobe signal input circuit 31 are input circuits as shown in FIG. 4, and composed of the P-channel MOS transistors 100, 101, and 105; the N-channel MOS transistors 102, 103, and 104; and the inverter circuit 106. As shown in FIG. 5, the D-type flip-flop circuits 321, 322, 323, and 325 are composed of the transfer gates 110, 111, 112, and 113; and the inverter circuits 114, 115, 116, 117, and 118. As shown in FIG. 6, the D-type flip-flop circuit 324 is composed of transfer gates 119, 120, 121, and 122; and the inverter circuits 123, 124, 125, 126, and 127.

Figure 3:
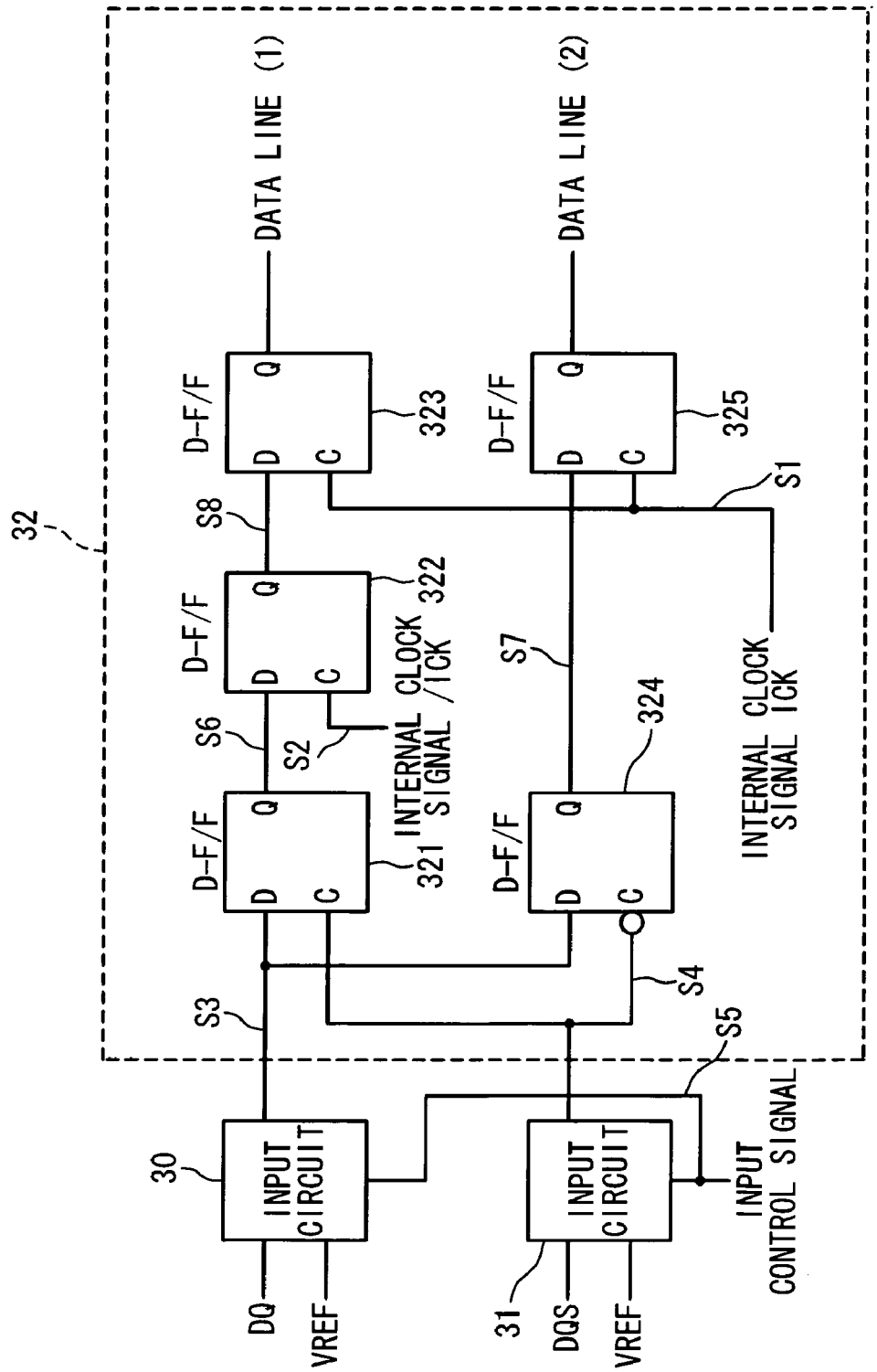
FIG. 3 is a block diagram showing the configuration of a data circuit used in the conventional DDR DRAM.

The data latch circuit in the first embodiment differs from the conventional data latch circuit shown in FIG. 3 in the control signals supplied to the data signal input circuit 30 and the data strobe signal input circuit 31. In the data latch circuit in the first embodiment, the control signals are independent from each other, and the data input control signal S11 is supplied to the data signal input circuit 30 and the data strobe input control signal S14 is supplied to the data strobe signal input circuit 31.

Figure 13:
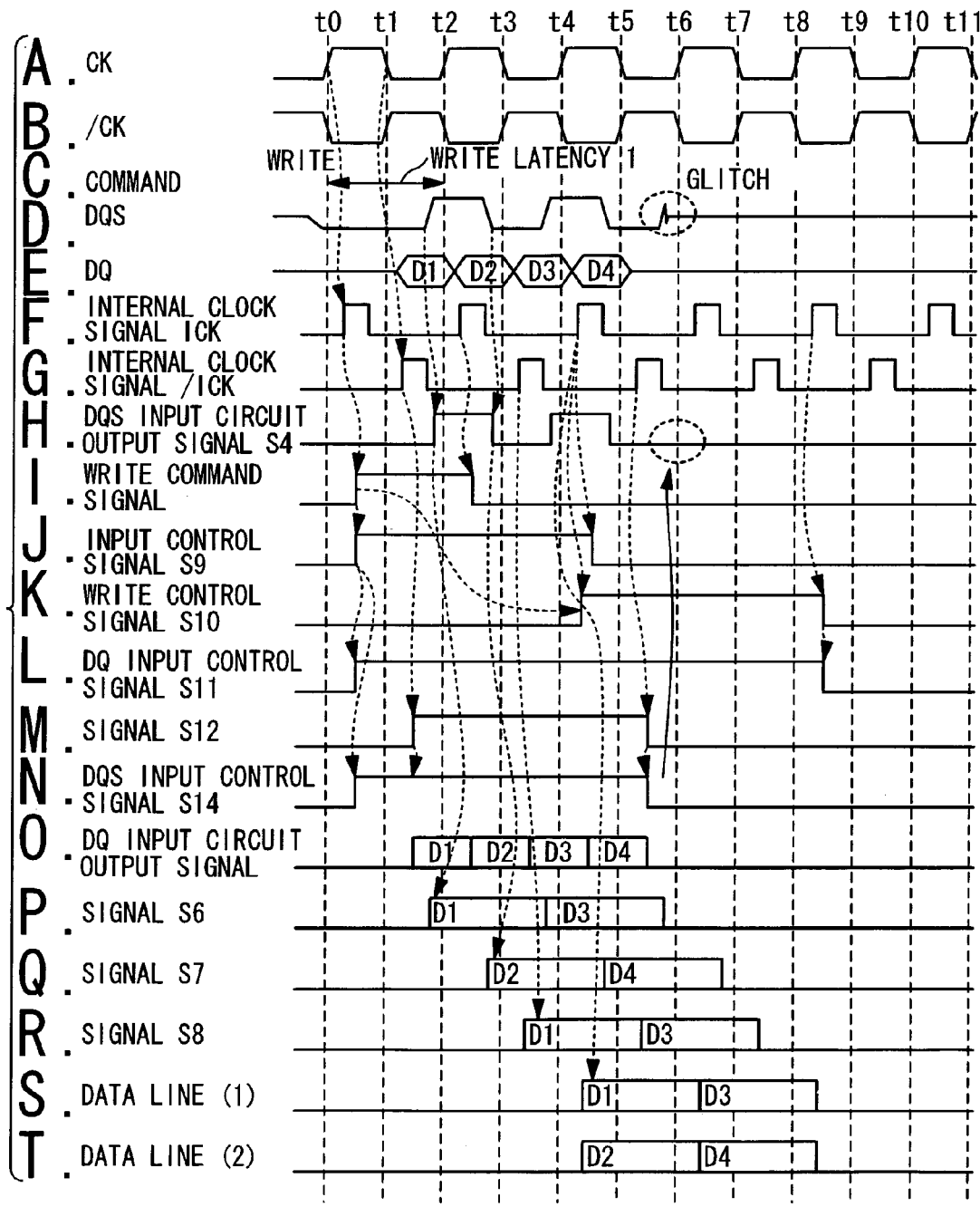
FIGS. 13A to 13T are timing charts showing signal waveforms of various portions of the DDR DRAM according to the first embodiment of the present invention in case of the burst length of 4, and the WRITE latency of 1.

Next, referring to FIGS. 13A to 13T, an operation of the input control circuit of FIG. 10 and the data latch circuit of FIG. 12 will be described in detail. FIGS. 13A to 13T are timing charts showing signal waveforms of various portions of the DDR DRAM according to the first embodiment in case of the burst length of 4 and the write latency of 1. As in the conventional example, FIGS. 13A and 13B show external clock signals CK and /CK. In the DDR DRAM, the CK input circuit & internal clock signal generating circuit 24 generates an internal clock signals ICK S1 shown in FIG. 13F from the external clock signal CK and an internal clock signal /ICK S2 shown in FIG. 13G from the external clock signal /CK. The internal clock signal ICK S1 is synchronous with the rising edge of the clock signal CK and the internal clock signal /ICK S2 is synchronous with the rising edge of the inversion clock signal /CK.

A write command (WRITE) is supplied at a time t0 as shown in FIG. 13C, and then a write command signal with the signal width of one clock period is generated by the command decoder in response to the internal clock signal ICK as shown in FIG. 13I. Also, the write control circuit 1 generates the input control signal S9 based on the write command signal and a mode signal indicating the burst length and generated based on a mode set command by the mode register 19 in response to the internal clock signal ICK S1, as shown in FIG. 13J. A write control signal S10 is generated by the control circuit 21 to rise in response to the write command signal and the third clock pulse of the internal clock signal ICK and to fall in response to the fifth clock pulse of the internal clock signal ICK, as shown in FIG. 13K. The data input control signal S11 is generated from the input control signal S9 and the write control signal S10 by the NOR circuit 2 and the inverter circuit 3 as shown in FIG. 13L. The D-type flip-flop circuit 4 generates the signal S12 from the input control signal S9 in response to the internal clock signal /ICK as shown in FIG. 13M, and the D-type latch circuit 5 latches the signal S12 in response to the data strobe signal input circuit output signal S4 shown in FIG. 13H, to output the signal S13. Thus, the data strobe input control signal S14 is generated from the signal S13 and the input control signal S9 by the NOR circuit 6 and the inverter circuit 7. As mentioned above, the burst length is 4, and the write latency is 1. Therefore, the input control signal S9 has the signal width of 2 clock periods as shown in FIG. 13J, and the write control signal S10 is delayed from the input control signal S9 by 2 clock periods as shown in FIG. 13K, since there is one cycle period from the data input to the start of writing into the memory cell. Further, referring to FIG. 13H, when the data strobe signal input circuit output signal S4 is in the low level, the signal S12 is passed through the D-type latch circuit 5 to generate the output signal S13, because the D-type latch circuit 5 is configured as shown in FIG. 11. Thus, when either of the input control signal S9 shown in FIG. 13J and the output signal S13 is in the high level, the data strobe input control signal S14 is in the high level as shown in FIG. 13N.

As shown in FIG. 4, the input circuit 30 or 31 is composed of a differential amplifier circuit and an output circuit, and the differential amplifier circuit is composed of the P-channel MOS transistors 100 and 101 and the N-channel MOS transistors 102, 103, and 104. The output circuit is composed of the P-channel MOS transistor 105 and the inverter circuit 106. When the data input control signal S11 is supplied, the differential amplifier circuit compares the signal voltage of input data signal with the signal voltage Vref of the reference signal to generate an output signal to the output circuit. In the input circuit, when the input data signal is in the low level, the output of the input circuit 30 or 31 is fixed to the low level. More specifically, in the data strobe signal input circuit 31, when the data strobe input control signal S14 shown in FIG. 13N is in the low level, the data strobe signal input circuit output signal S4 is fixed to the low level as shown in FIG. 13H. On the contrary, when the data strobe input control signal S14 shown in FIG. 13N is in the high level, the data strobe signal input circuit output signal S4 shown in FIG. 13H changes depending on the data strobe signal voltage. Therefore, the data strobe input control signal S14 shown in FIG. 13N stops the data strobe signal input circuit 31 before a glitch waveform appears around a time t6 when the postamble period of the data strobe signal ends, so that the data strobe signal input circuit output signal S4 shown in FIG. 13H does not operate for the glitch waveform.

Thus, of the data D1 to D4 supplied to the data terminal 26 during a period from time t2 to time t5, the data D1 and D3 are latched as the data signal input circuit output signal S3 shown in FIG. 13O by the D-type flip-flop circuit 321 in response to the rising edge of the data strobe signal input circuit output signal S4 shown in FIG. 13H, and outputted as a signal S6 shown in FIG. 13P. Subsequently, the signal S6 shown in FIG. 13P is latched by the D-type flip-flop circuit 322 in response to the rising edge of the internal clock signal /ICK S2 shown in FIG. 13G. The output of the circuit 322 is transferred as the signal S8 shown in FIG. 13R to the D-type flip-flop circuit 323, then latched in response to the rising edge of the internal clock signal ICK S1 shown in FIG. 13F, and transmitted to the data line (1) as shown in FIG. 13S. Meanwhile, the data D2 and D4 inputted to the data terminal 26 are latched as the data signal input circuit output signal S3 by the D-type flip-flop circuit 324 in response to the rising edge of an inversion signal of the data strobe signal input circuit output signal S4 shown in FIG. 13H, outputted as a signal S7 shown in FIG. 13Q, latched by the D-type flip-flop circuit 325 in response to the rising edge of the internal clock signal ICK signal S1 shown in FIG. 13F, and then transmitted to the data line (2) shown in FIG. 13T.

Next, an operation when the write latency is 2 will be described, with reference to FIGS. 14A to 14T. In this case, it is supposed that the burst length is 4, and there is one clock period from data input to start of write operation into the memory cell. Usually, the write latency is fixed or previously set based on a mode set command. When the write latency is 2, there is a period of two clock period between the write command shown in FIG. 14C and the data input to the data terminal 26. Therefore, when the write command shown in FIG. 14C is inputted at time t0, the data signal is inputted to the data terminal 26 in a period between t4 and t7. A write command signal is generated by the command decoder 19 to have the signal width of one clock period as shown in FIG. 14I. Next, a write control signal S10 is generated from the write command signal shown in FIG. 14I and a mode signal indicating the burst length and generated based on a mode set command by the mode register 19 as shown in FIG. 14K and has the signal width of two clock periods. Then, the write control signal S10 has been delayed by the write counter circuit by the number of clock periods of the write latency and further by the number of clock cycles from the data input to the start of write operation into the memory cell array 15. When the write latency is 2, the input control signal S9 shown in FIG. 14J is a signal on the way of a counter circuit, and has the signal width of two clock period. The input control signal S9 is delayed by one clock period from the write command signal shown in FIG. 14C and the timing of the signal S9 is delayed more than a case where the write latency is 1.

Figure 14:
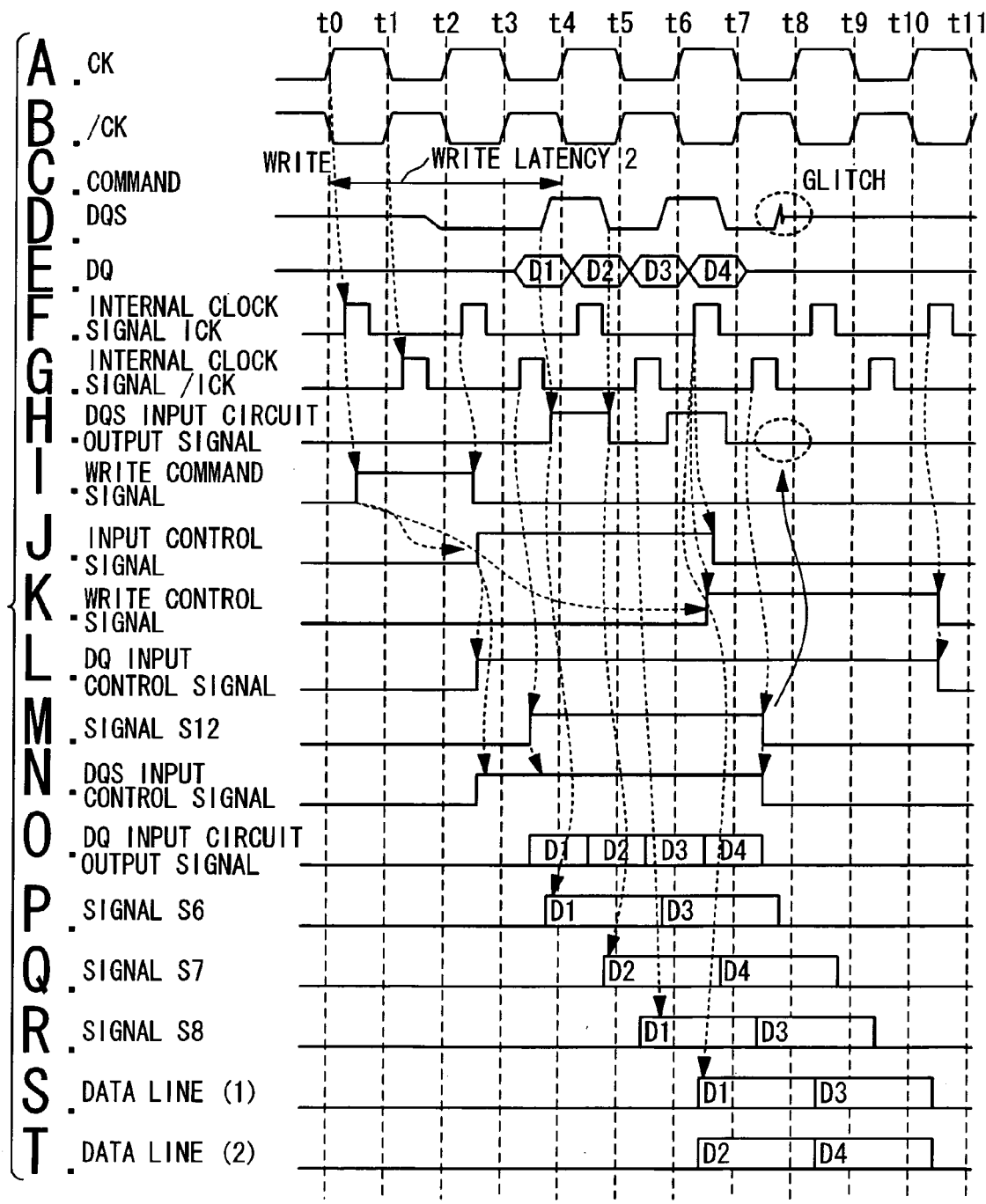
FIGS. 14A to 14T are timing charts showing signal waveforms of various portions of the DDR DRAM according to the first embodiment of the present invention in case of the burst length of 4, and the WRITE latency of 2.

In this way, the falling edge of the data strobe input control signal S14 shown in FIG. 14N that inactivates the input circuit DQS is also delayed by one clock period because of increase of the write latency. Consequently, as in case of the operation shown in FIGS. 13A to 13T, also shown in FIG. 14, the data strobe signal input circuit output signal is stopped before a glitch waveform appears. Thus, the data strobe signal input circuit output signal S4 shown in FIG. 14H does not affect adverse influence.

As mentioned above, the write counter circuit of the write control circuit 1 can also support the write latency. In this case, any extra counter circuit can be omitted since an internal signal in the write control circuit 1 can be used as the input control signal S9 shown in FIG. 14J.

Next, the semiconductor memory device such as a DDR DRAM according to the second embodiment of the present invention will be described in detail with reference to the attached drawings.

Usually, a delay element is connected to an input circuit to adjust the input setup time and an input hold time. To adjust the input setup time and the input holding time for the data signal to the data strobe signal, an adjustable delay element can be provided in the input circuit 30. However, this delay element may be provided not only in the data signal input circuit 30 but also in the data strobe signal input circuit 31. In such a case, a data strobe signal input circuit output signal is switched with a delay time of the delay element. Thus, the data strobe input control signal S14 is also delayed, which requires an extra time to stop the data strobe signal input circuit 31. This may results in failure to stop the data strobe signal input circuit 31 before a glitch waveform is generated.

Figure 15:
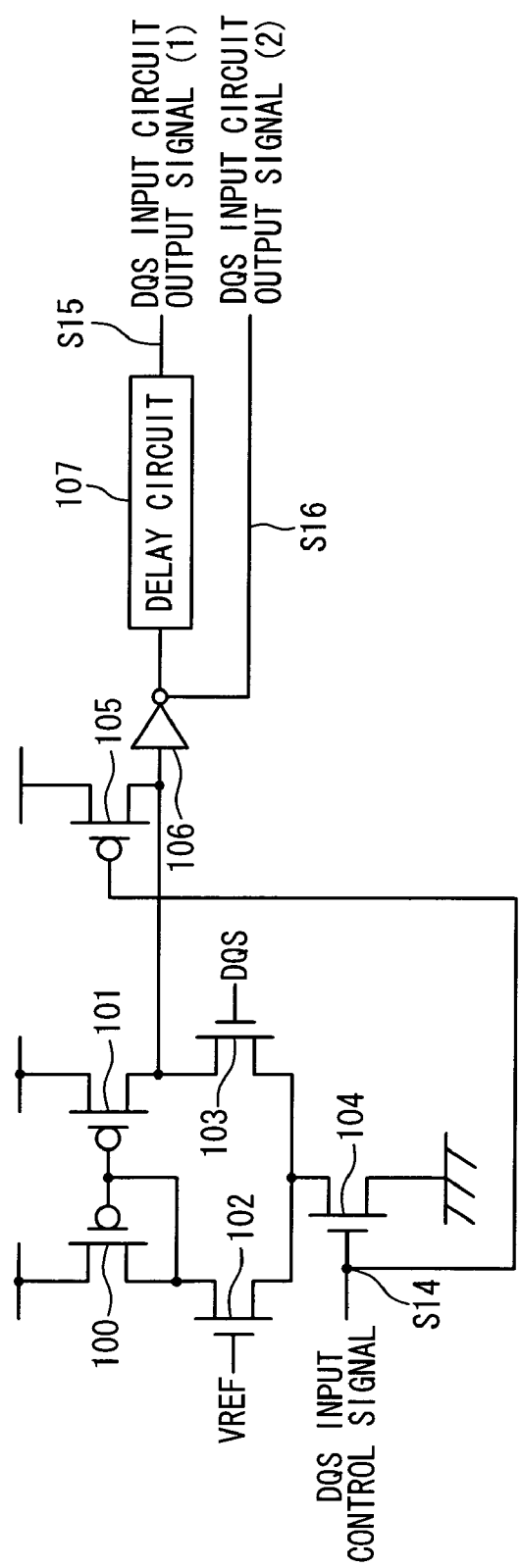
FIG. 15 is a block diagram showing the configuration of the data strobe signal input circuit used in the DDR DRAM according to a second embodiment of the present invention.
Figure 16:
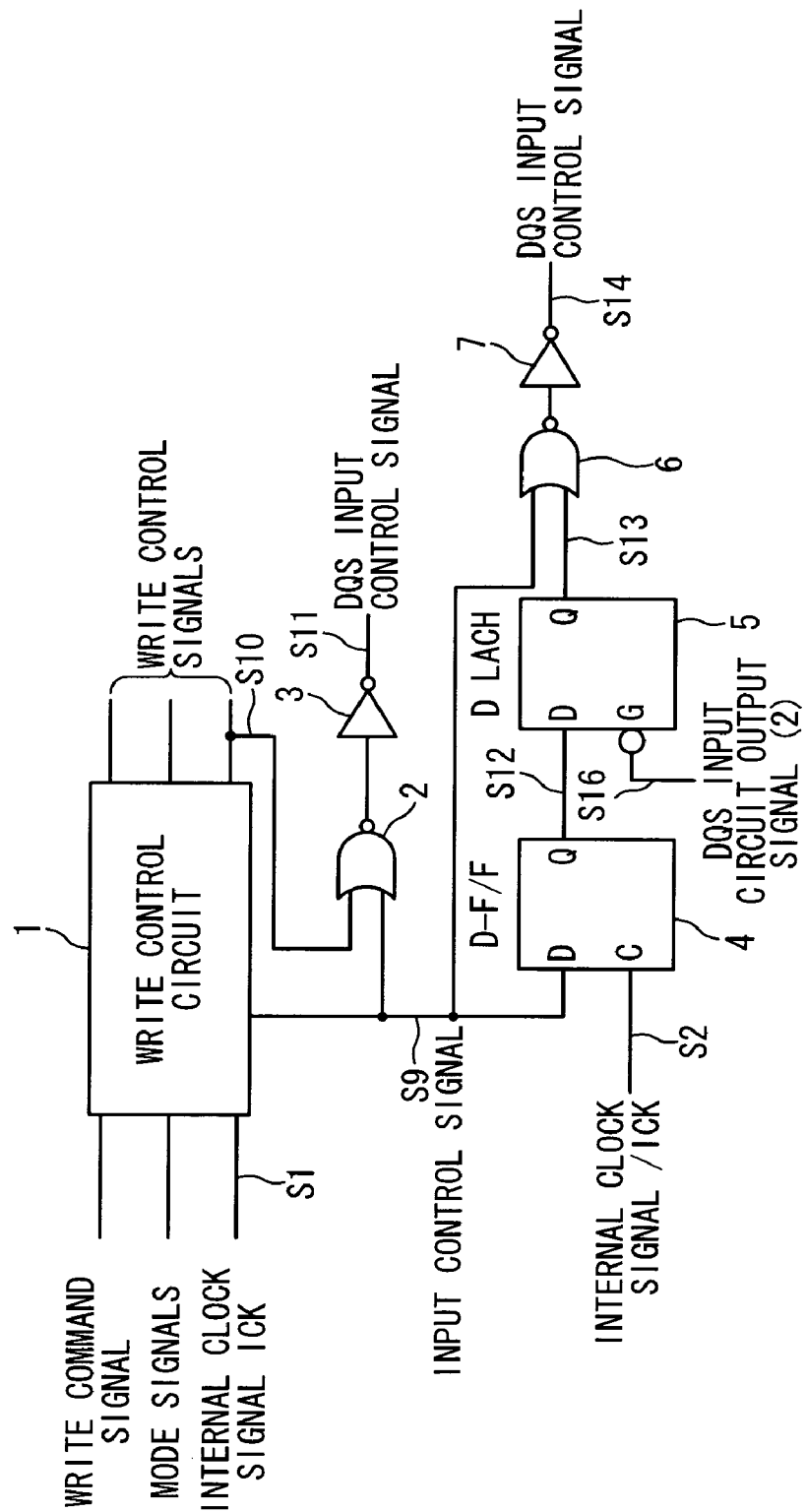
FIG. 16 is a block diagram showing the configuration of the input control circuit when the data strobe signal input circuit shown in FIG. 15 is used.
Figure 17:
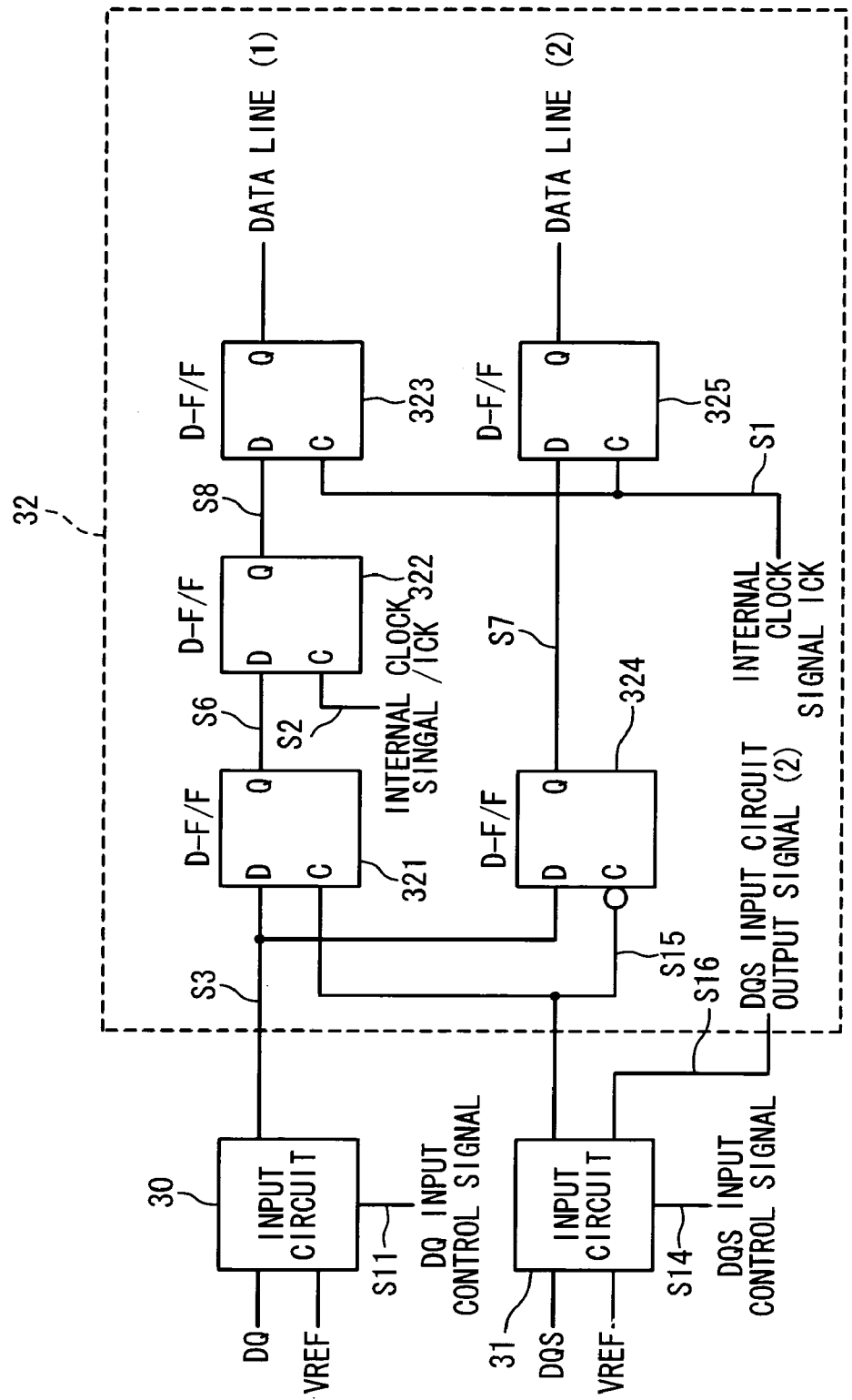
FIG. 17 is a block diagram showing the configuration of the data circuit in the DDR DRAM according to the second embodiment of the present invention.

FIG. 15 is a block diagram showing the configuration of the data strobe signal input circuit 31 in the second embodiment of the present invention, FIG. 16 is a block diagram showing the configuration of the input control circuit, and FIG. 17 is a block diagram showing the configuration of the data circuit. The data strobe signal input circuit 31 of FIG. 15 is composed of the P-channel MOS transistors 100, 101, and 105; the N-channel MOS transistors 102, 103, and 104; the inverter circuit 106; and a delay circuit 107 for adjusting a delay time. A data strobe signal input circuit output signal (1) S15 passing through the delay element 107 of FIG. 15 is used as a data latch signal by the D-type flip-flop circuits 321 and 324 of the data circuit of FIG. 17. A data strobe signal input circuit output signal (2) S16 not passing through the delay element 107 is used as a latch signal of the D-type latch circuit 5 in the input control circuit of FIG. 16. Accordingly, even when the data strobe signal input circuit output signal (1) S15 is obtained through delay by the delay element 107, the data strobe input control signal S14 is not delayed. As a result, regardless of the delay time of the delay element 107, the data strobe input control signal S14 can be switched from a high level to a low level with the data strobe signal input circuit output signal (2) S16 with a minimum delay time, thereby stopping the data strobe signal input circuit 31.

The circuits used in the present invention are not limited to the embodiments mentioned above, and thus can be replaced with those circuits which have the same function. That is, a circuit in which the input signals and the output signals are same as in the embodiments can be used instead of the circuit used in the embodiments.

What is claimed is:

1. A dynamic random access memory (DRAM) comprising:
   a data signal input circuit configured to input a data signal in response to a data control signal;
   a data strobe signal input circuit configured to input a data strobe signal in response to a data strobe control signal;
   a control circuit configured to separately generate said data control signal and said data strobe control signal;
   a data latch circuit configured to latch said data signal from said data signal input circuit in response to said data strobe signal from said data strobe signal input circuit;
   a memory cell array having a plurality of memory cells arranged in a matrix, wherein said latched data signal is stored in a selected one of said plurality of memory cells through said data buffer;
   an amplifier circuit configured to amplify a data signal read out from said selected memory cell; and
   an output circuit configured to output the amplified data signal.

2. The DRAM according to claim 1, wherein said control circuit generates said data strobe control signal to deactivate said data strobe signal input circuit before said data strobe signal inputted to said data strobe signal input circuit is set to a state other than high and low states.

3. The DRAM according to claim 1, wherein said data control signal and said data strobe control signal are independent from each other at timing.

4. The DRAM according to claim 1, wherein said control circuit comprises:
   a write control circuit configured to generate first and second signals from an internal clock signal which is synchronized with an external clock signal, a write command signal and a mode signal specifying an operation mode;
   a first circuit configured to generate said data control signal from said first and second signals; and
   a second circuit configured to generate said data control signal from said first signal in response to an inversion signal of said data strobe signal.

5. The DRAM according to claim 4, wherein said second circuit comprises:
  a D-type flip-flop circuit configured to latch said first signal in resynchronization with an inversion signal of said internal clock signal to generate a third signal;
  a D-type latch circuit configured to pass said third signal in response to said data strobe signal to generate said strobe control signal; and
  an OR circuit configured to output a logical summation of said first signal and the passed third signal.

6. The DRAM according to claim 4, wherein said mode signal is generated by an operation mode setting circuit based on an input command and indicates a number of data on said data signal.

7. The DRAM according to claim 4, wherein said mode signal is generated based on a number of data on said data signal and a number of clock periods from said writing command signal to output of said data signal.

8. The DRAM according to claim 1, wherein said data strobe signal input circuit further comprises:
  a delay circuit configured to delay said data strobe signal, and
  said data strobe signal supplied to said data latch circuit is said delayed data strobe signal.

9. An input control circuit comprising:
  a write control circuit configured to generate first and second signals from an internal clock signal which is synchronized with an external clock signal, a write command signal and a mode signal specifying an operation mode;
  a first latch circuit configured to latch said first signal in synchronization with a falling edge of an external clock signal; and
  a second latch circuit configured to pass an output signal of said first latch circuit for a period during which an output signal of a data strobe circuit is in a low level,
  wherein said second latch circuit switches said data strobe circuit from a active state to a inactive state in response to an output signal of said second latch circuit.

10. The input control circuit according to claim 9, wherein said second latch circuit switches a falling edge of the output signal of said second latch circuit at a timing delayed for a period by which a write command is delayed.

11. An input control method comprising:
  inputting a data signal in response to a data control signal;
  inputting a data strobe signal in response to a data strobe control signal;
  latching said data signal in response to said data strobe signal; and
  separately generating said data control signal and said data strobe control signal.

12. The input control method according to claim 11, wherein said separately generating comprises:
  generating said data strobe control signal; and
  setting a generation timing of said data strobe control signal in response to an internal clock signal associated with a low level period of said data strobe signal after the last data on said data signal.

13. The input control method according to claim 11, wherein said separately generating comprises:
  generating a first signal by counting an internal signal synchronized with the rising edge of an external clock signal, from a write command signal for an active stated of a preset signal;
  generating a second signal by latching said first signal in response to an internal signal synchronized with a falling edge of an external clock signal; and
  passing said second signal in response to an internal data strobe signal corresponding to a low level period of said data strobe signal.

14. The input control method according to claim 12, wherein said preset signal is a signal indicative of a number of said data.

15. The input control method according to claim 12, wherein said preset signal is a signal indicative of a number of the data on said data signal and a number of clock cycles in a period from said write command signal to said data signal.

16. The input control method according to claim 12, further comprising:
  using a first output signal of said data strobe circuit to which a data strobe signal passing through a delay circuit is supplied for a data latch circuit; and
  using a second output signal of said data strobe circuit which does not pass said delay circuit for a control circuit.

* * * * *